Jan. 25, 1966
P. E. DRAPKIN
3,231,824
PULSE COUNTER DETECTOR
Filed Aug. 2, 1962
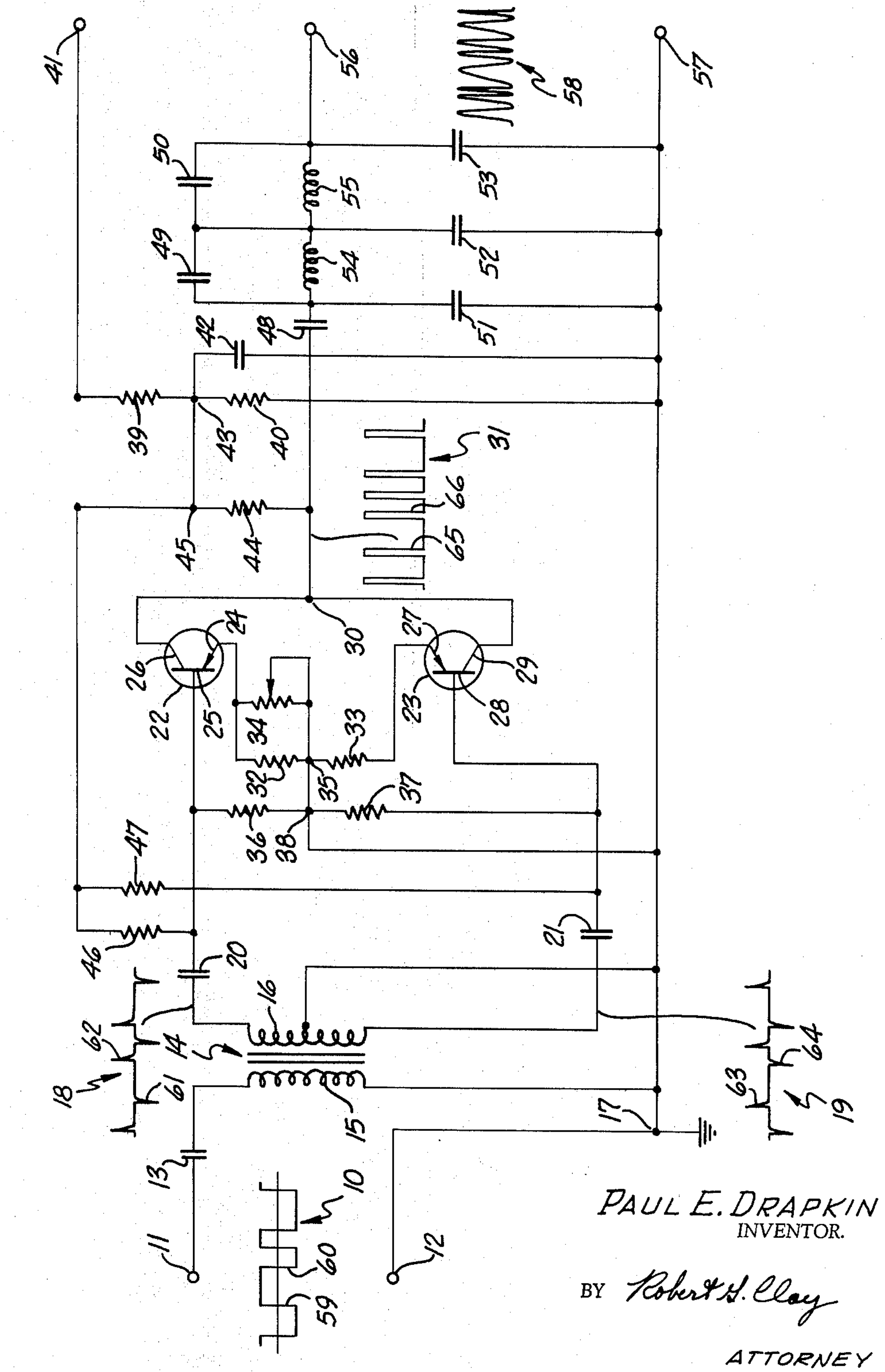
PAUL E. DRAPKIN
INVENTOR.
BY Robert G. Clay
ATTORNEY United States Patent Office 3,231,824

Patented Jan. 25, 1966

3,231,824

PULSE COUNTER DETECTOR

Paul E. Drapkin, San Francisco, Calif., assignor to Ampex Corporation, Redwood City, Calif., a corporation of California Filed Aug. 2, 1962, Ser. No. 214,333
6 Claims. (Cl. 329—106)

This invention relates to pulse counter detectors, and more particularly to a pulse counter detector utilizing the storage effect of transistors for demodulating a frequency modulated square wave.

Heretofore, pulse counter detectors used for detecting frequency modulated square waves have not taken advantage of a unique property of transistors. The present invention is directed to just such a detector.

The pulse counter detector circuit to be described utilizes a property of a transistor that is known as charge storage. To appreciate the concept of charge storage, it is to be noted that a transistor may be operated in a condition of voltage saturation in which, for example, the collector electrode is effectively short-circuited to the base electrode. More precisely, when the collector current has attained a maximum value determined by the external circuit and yet not sufficient to carry away or dissipate all of the injected minority carriers, a saturation condition prevails in which there is a surplus of minority carriers at the base-collector junction. In order to desaturate the transistor, it is necessary that the surplus of minority carriers be first swept away by recombination, absorption to the collector or base electrodes, or otherwise, and the time required for this to occur is referred to as the charge storage time. Since the inherent charge storage time of a high frequency transistor is relatively short, it may be advantageously used to detect the zero cross-over points of a square wave that has been frequency modulated by a video signal. Such a pulse counter detector, constructed in accordance with the invention, is described in detail in the ensuing description.

It is, therefore, an object of this invention to provide a novel pulse counter detector utilizing the storage effect of transistors for demodulating a frequency modulated square wave.

It is a particular object of this invention to provide a novel pulse counter detector having good linearity at a minimum of cost and complication.

Other objects and advantages of the invention will become apparent from the following detailed description of a preferred embodiment of the invention.

A pulse counter detector circuit employing the teachings of the present invention comprises a pair of high frequency transistors having relatively short charge storage times. The high frequency transistors are of similar conductivity types, and have equal charge storage times, such as the Philco–2N2048. Means are provided for differentiating a frequency modulated square wave to produce a sharp spike pulse at each zero cross-over point of the square wave. A phase-splitting means receives the sharp pulses and then applies the same to the respective control electrodes of the transistors. The charge storage time of each transistor must be less than the time between successive sharp pulses applied to the control electrode. One transistor is driven into saturation by a sharp pulse at the control electrode and desaturates before the next sharp pulse arrives, and then the other transistor is driven into saturation by a sharp pulse at the control electrode and desaturates before the next sharp pulse arrives. The high frequency transistors, therefore, alternately go through saturation-desaturation cycles to form output pulses having a fixed time duration equal to the charge storage time. Thus, the novel pulse counter detector circuit detects the zero cross-over points of the frequency modulated square wave by using the storage effect of the transistors to form a fixed duration pulse for each zero cross-over point.

Referring to the sole figure, an input square wave that has been frequency modulated by a video signal is illustrated by reference numeral 10. A transformer 14 consists of a primary winding 15 and a center-tapped secondary winding 16. A capacitor 13 is connected between input terminal 11 and one end of primary winding 15. The other end of primary winding 15 is connected to ground 17. The center tap of secondary winding 16 of transformer 15 is also connected to ground 17. The capacitor 13 differentiates the frequency modulated square wave 10 to produce a positive or negative sharp spike pulse at each zero cross-over point of the square wave. The sharp pulses are received by the transformer 14, which acts as a phase splitter to produce two outputs of opposite polarity at the ends of the center-tapped secondary winding 16. The waveforms of the two outputs are illustrated by reference numerals 18 and 19. Each waveform 18, 19 has a carrier frequency equal to the carrier frequency of the input square wave 10.

The preferred embodiment of this invention utilizes a pair of PNP conductivity type transistors 22 and 23 having relatively short charge storage times, such as the Philco–2N2048. The transistors 22 and 23 have good high frequency response characteristics and have equal charge storage times. Each of the PNP transistors 22 and 23 has the usual emitter, base and collector electrodes, which are indicated by reference numerals 24, 25 and 26, respectively, for transistor 22 and reference numerals 27, 28 and 29, respectively, for transistor 23. It is not intended to limit transistors 22 and 23 to PNP conductivity type as NPN conductivity type transistors may also be used. The base electrodes 25 and 28 of transistors 22 and 23 are coupled to ends of the center-tapped secondary winding 16 of transformer 14 through capacitors 20 and 21. The collector electrodes 26 and 29 of transistors 22 and 23 are connected together at a common terminal 30. The waveforms 18 and 19 appearing between the grounded center tap and the opposite ends of the secondary winding 16 are applied to the bases 25 and 28 of the high frequency transistors 22 and 23. The charge storage times of the transistors 22 and 23 are respectively less than the times between successive sharp pulses of the waveforms 18 and 19 applied to the bases 25 and 28. Since the transistors 22 and 23 are PNP conductivity type, the sharp negative pulses of the waveforms 18 and 19 drive the transistors 22 and 23 into saturation. Transistor 22 is driven into saturation by a sharp negative pulse at the base electrode 25 and desaturates before a succeeding sharp positive pulse arrives, and then transistor 23 is driven into saturation by a sharp negative pulse at the base electrode 28 and desaturates before a succeeding sharp positive pulse arrives. The high frequency transistors 22 and 23, therefore, alternately go through saturation-desaturation cycles to form output pulses, each having a fixed time duration equal to the charge storage time. The waveform of the fixed duration pulses appears at common collector terminal 30 and is illustrated by reference numeral 31. The waveform 31 has a carrier frequency equal to twice the carrier frequency of the original square wave 10. Thus, the pulse counter detector circuit detects the zero cross-over points of the frequency modulated square wave 10 by using the storage effect of transistors 22 and 23 to form a fixed duration pulse for each zero cross-over point.

The emitter electrodes 24 and 27 of transistors 22 and 23 are connected together at a common terminal 35 through a pair of resistors 32 and 33. A voltage divider 34 is connected between the emitter electrode 24 of transistor 22 and common terminal 35. The adjustable arm of voltage divider 34 may be adjusted to compensate for impedance mismatch between the characteristics of the transistors 22 and 23 and component connections thereto. A pair of resistors 36 and 37 is connected between the base electrodes 25 and 28 of transistors 22 and 23 with the common terminal 38 therebetween being connected to common terminal 35 and also connected to ground 17.

A voltage divider consisting of resistors 39 and 40 is connected between a negative terminal of a potential source 41 and ground 17. A by-pass capacitor 42 is connected across resistor 40. A resistor 44 is connected between common collector terminal 30 and a common terminal 43 between resistors 39 and 40. A resistor 46 is connected at one side to the juncture 45 between resistor 44 and terminal 43, and at the other side to the base electrode 25 of transistor 22 while a resistor 47 is connected between the juncture 45 and the base electrode 28 of transistor 23.

A low pass filter network is coupled to the common collector terminal 30 through capacitor 48. The filter network consists of capacitors 49, 50, 51, 52 and 53 and inductors 54 and 55. The double carrier frequency of waveform 31 appearing at common collector terminal 30 is filtered out by the low pass filter. Thus, the original video signal is isolated by the low pass filter and appears across output terminals 56 and 57, as illustrated by reference numeral 58.

The operation of the pulse-counter detector circuit will be explained for two zero cross-over points of the frequency modulated square wave 10. The zero cross-over points are indicated by reference numerals 59 and 60. When the frequency modulated square wave 10 is differentiated by capacitor 13, a sharp positive spike pulse is produced at zero cross-over point 59 and a sharp negative spike pulse is produced at zero cross-over point 60. The phase-splitting transformer 14 receives the two sharp pulses and produces two outputs of opposite polarity at the ends of the center-tapped secondary winding 16. Sharp spike pulses 61 and 62 of waveform 18 indicate one output and sharp spike pulses 63 and 64 indicate the other output. The sharp pulses 61 and 62 are applied to base electrode 25 of transistor 22 while sharp pulses 63 and 64 are applied to base electrode 28 of transistor 23.

Assume that PNP transistors 22 and 23 are not conducing. The sharp negative pulse 61 of waveform 18 has sufficient amplitude to drive the PNP transistor 22 into saturation. The sharp positive pulse 63 of waveform 19, however, has no affect on the non-conducting PNP transistor 23. Since the charge storage time of transistor 22 is less than the time between the sharp negative pulse 61 and the sharp positive pulse 62, transistor 22 desaturates before sharp positive pulse 62 arrives at the base electrode 25. The transistor 22 goes through a saturation-desaturation cycle to form an amplified output pulse having a fixed time duration equal to its charge storage time. The amplified output pulse formed by transistor 22 appears at common collector terminal 30 and is indicated by fixed duration pulse 65 of waveform 31. Thus, the circuit detects the zero cross-over point 59 of the frequency modulated square wave 10 by utilizing the storage effect of transistor 22 to form the fixed duration pulse 65. In a similar manner, sharp negative pulse 64 of waveform 19 operates PNP transistor 23 to form a fixed duration pulse 66. The cross-over point 60, therefore, is detected by forming the fixed duration pulse 66 of waveform 31. Accordingly, the circuit operates to form a fixed duration pulse for each zero cross-over point of the frequency modulated square wave 10.

Thus, it is seen that the pulse counter detector circuit utilizes the storage effect of high frequency transistors for demodulating a square wave that has been frequency modulated by a video signal. Furthermore, the detector circuit has good linearity at a minimum of cost and complication.

Although the present invention has been shown and described in terms of a preferred embodiment, changes and modifications which do not depart from the inventive concepts taught herein will suggest themselves to those skilled in the art. Such changes and modifications are deemed to fall within the scope of this invention.

What is claimed is:

1. A pulse counter detector circuit for converting a frequency modulated square wave input into a fixed duration pulse output comprising:

a pair of transistors having equal charge storage times, each of said transistors having emitter, base and collector electrodes;

the collector electrodes of said transistors being coupled together;

means for differentiating the input frequency modulated square wave to produce sharp pulses; and phase-splitting means for receiving the sharp pulses and for applying the same to the respective base electrodes, each of said transistors having a charge storage time less than the time between successive sharp pulses applied to the respective base electrodes, and said transistors alternately going through saturation-desaturation cycles to form fixed duration pulses.

2. A pulse counter detector circuit for converting a frequency modulated square wave input into a video output comprising:

a pair of transistors having equal charge storage times, each of said transistors having emitter, base and collector electrodes;

the collector electrodes of said transistors being coupled together;

means for differentiating the input frequency modulated square wave to produce sharp pulses;

phase-splitting means for receiving the sharp pulses and for applying the same to the respective base electrodes, each of said transistors having a charge storage time less than the time between successive sharp pulses applied to the respective base electrodes, and said transistors alternately going through saturation-desaturation cycles to form the fixed duration pulses on their joined collector electrodes; and means for filtering out the carrier frequency of the fixed duration pulses.

3. A pulse counter detector circuit for converting a frequency modulated square wave input into a fixed duration pulse output comprising:

first and second similar conductivity type transistors having equal charge storage times, each of said transistors having emitter, base and collector electrodes;

the collector electrodes of said transistors being coupled together;

means for differentiating the input frequency modulated square wave to produce sharp pulses at the zero cross-over points of the square wave; and phase-splitting means for receiving the sharp pulses and for applying the same to the respective base electrodes, each of said transistors having a charge storage time less than the time between successive sharp pulses applied to the respective base electrodes, said first transistor driven into saturation by a sharp pulse at the base electrode thereof before the next sharp pulse arrives, and then said second transistor driven into saturation by a sharp pulse at the base electrode thereof and desaturating before the next pulse arrives, and said transistors alternately going through a saturation-desaturation cycle to form a fixed duration pulse for each zero cross-over point of the frequency modulated square wave.

4. A pulse counter detector circuit for demodulating a square wave that has been frequency modulated by a video signal to produce a variable D.C. video output signal comprising:

first and second similar conductivity type transistors having equal and relatively short charge storage times, each of said transistors having emitter, base and collector electrodes;

capacitive means for differentiating the frequency modulated square wave to produce sharp pulses at the zero cross-over points of the square wave;

a phase-splitting transformer for receiving the sharp pulses and for applying the same to the respective base electrodes, each of said transistors having a charge storage time less than the time between successive sharp pulses applied to the respective base electrodes, said first transistor being driven into saturation by a sharp pulse at the base electrode thereof before the next sharp pulse arrives, and then said second transistor being driven into saturation by a sharp pulse at the base electrode thereof and desaturating before the next pulse arrives, and said transistors alternately going through saturation-desaturation cycles to form fixed duration pulses for the zero cross-over points of the frequency modulated square wave; and a low pass filter coupled to the collector electrodes of said transistors for isolating the output video signal.

5. A pulse counter detector circuit for converting a frequency modulated square wave input into a fixed duration pulse output comprising: a pair of active elements having equal charge storage times, each of said active elements having input, control, and output electrodes, the output electrodes of said active elements being coupled together, means for differentiating the input frequency modulated square wave to produce sharp pulses, and phase splitting means for receiving the sharp pulses and for applying the sharp pulses to the respective active elements, each of the active elements having a charge storage time less than the time between successive sharp pulses applied to the respective control electrodes, and said active elements being arranged to pass alternately through saturation-desaturation cycles to form fixed duration pulses on their respective output electrodes.

6. A circuit for converting an input waveform into a fixed duration pulse output including: a pair of active switching elements having control electrodes and output electrodes and having charge storage times shorter than the period of the input waveform, means coupled to the control electrodes of the active switching elements for producing sharp spike pulses in response to the instantaneous frequency characteristics of the input waveform, the sharp spike pulses being of such polarity and amplitude as to cause the active switching elements to go through alternate saturation-desaturation cycles and thus to form pulses at a junction point of their output electrodes having fixed durations equal to said charge storage times.

References Cited by the Examiner

UNITED STATES PATENTS

| | | | |
|---|---|---|---|
| 3,054,066 | 9/1962 | Crane | 307—88.5 |
| 3,099,800 | 7/1963 | Vinson et al. | 329—128 |
| 3,122,715 | 2/1964 | Buck | 332—16 |

ROY LAKE, *Primary Examiner.*

ALFRED L. BRODY, *Examiner.*